United States Patent
Shih et al.

(10) Patent No.: US 9,000,895 B2
(45) Date of Patent: Apr. 7, 2015

(54) DETECTION DEVICE FOR CONTAINER DATA CENTERS

(75) Inventors: Chi-Hsiung Shih, New Taipei (TW); Jui-Kun Hsieh, New Taipei (TW)

(73) Assignee: Zhongshan Innocloud Intellectual Property Services Co., Ltd., Zhongshan (CN)

( * ) Notice: Subject to any disclaimer, the term of this patent is extended or adjusted under 35 U.S.C. 154(b) by 565 days.

(21) Appl. No.: 13/284,968

(22) Filed: Oct. 30, 2011

(65) Prior Publication Data

US 2013/0076492 A1    Mar. 28, 2013

(30) Foreign Application Priority Data

Sep. 26, 2011   (TW) .............................. 100134677 A

(51) Int. Cl.
```
G06K 7/01      (2006.01)
H05K 7/14      (2006.01)
H05K 7/20      (2006.01)
```
(52) U.S. Cl.
CPC .......... H05K 7/1498 (2013.01); H05K 7/20836 (2013.01)

(58) Field of Classification Search
CPC ............ H05K 7/20836; H05K 7/1497; H05K 7/1498; H05K 7/20745
USPC .................. 340/10.5, 686.1, 572.4; 165/80.3; 454/184

See application file for complete search history.

(56) References Cited

U.S. PATENT DOCUMENTS

| | | | | |
|---|---|---|---|---|
| 7,336,184 B2 * | 2/2008 | Smith et al. | ................. | 340/572.4 |
| 7,411,505 B2 * | 8/2008 | Smith et al. | ................. | 340/572.4 |
| 7,854,652 B2 * | 12/2010 | Yates et al. | ................. | 454/184 |
| 2006/0087442 A1 * | 4/2006 | Smith et al. | ................. | 340/686.1 |
| 2006/0139180 A1 * | 6/2006 | Smith et al. | ................. | 340/686.1 |
| 2008/0060790 A1 * | 3/2008 | Yates et al. | ................. | 165/80.3 |

* cited by examiner

*Primary Examiner* — Vernal Brown
*Assistant Examiner* — Sisay Yacob
(74) *Attorney, Agent, or Firm* — Novak Druce Connolly Bove + Quigg LLP

(57) ABSTRACT

A detection device for cooling apparatuses of a container data center (CDC) includes a processor, a card reader, and a radio frequency identification (RFID) label. The RFID label includes a detection unit received inside the CDC, and wirelessly communicates with the card reader through the detection unit. The detecting unit detects statuses of the cooling apparatuses and environmental parameters of the CDC, and in response to the status of at least one of the cooling apparatuses and at least one of the environmental parameters of the CDC changing, the detection unit electrically isolates the RFID chip from the antenna.

9 Claims, 2 Drawing Sheets

DETECTION DEVICE FOR CONTAINER DATA CENTERS

BACKGROUND

1. Technical Field

The present disclosure relates to detection device for container data centers (CDCs), and particularly to a radio frequency identification (RFID) detection device for cooling apparatuses of CDCs.

2. Description of Related Art

Many network communication appliances, such as server devices and storage devices, are placed inside container data centers (CDCs) for centralized management and protection. Because the network communication appliances may generate much heat, cooling apparatuses, such as water pipes, are often installed in the CDCs to decrease temperatures in the CDCs and protect the network communication appliances from being overheated. Furthermore, the CDCs need detection devices to detect whether the cooling apparatuses are working normally. At present, most detection devices for the CDCs are surveillance cameras, which are expensive and need additional manpower for visual detection.

Therefore, there is room for improvement within the art.

BRIEF DESCRIPTION OF THE DRAWINGS

Many aspects of the present disclosure can be better understood with reference to the following drawings. The components in the various drawings are not necessarily drawn to scale, the emphasis instead being placed upon clearly illustrating the principles of the present disclosure. Moreover, in the drawings, like reference numerals designate corresponding parts throughout the figures.

DETAILED DESCRIPTION

Figure 1:
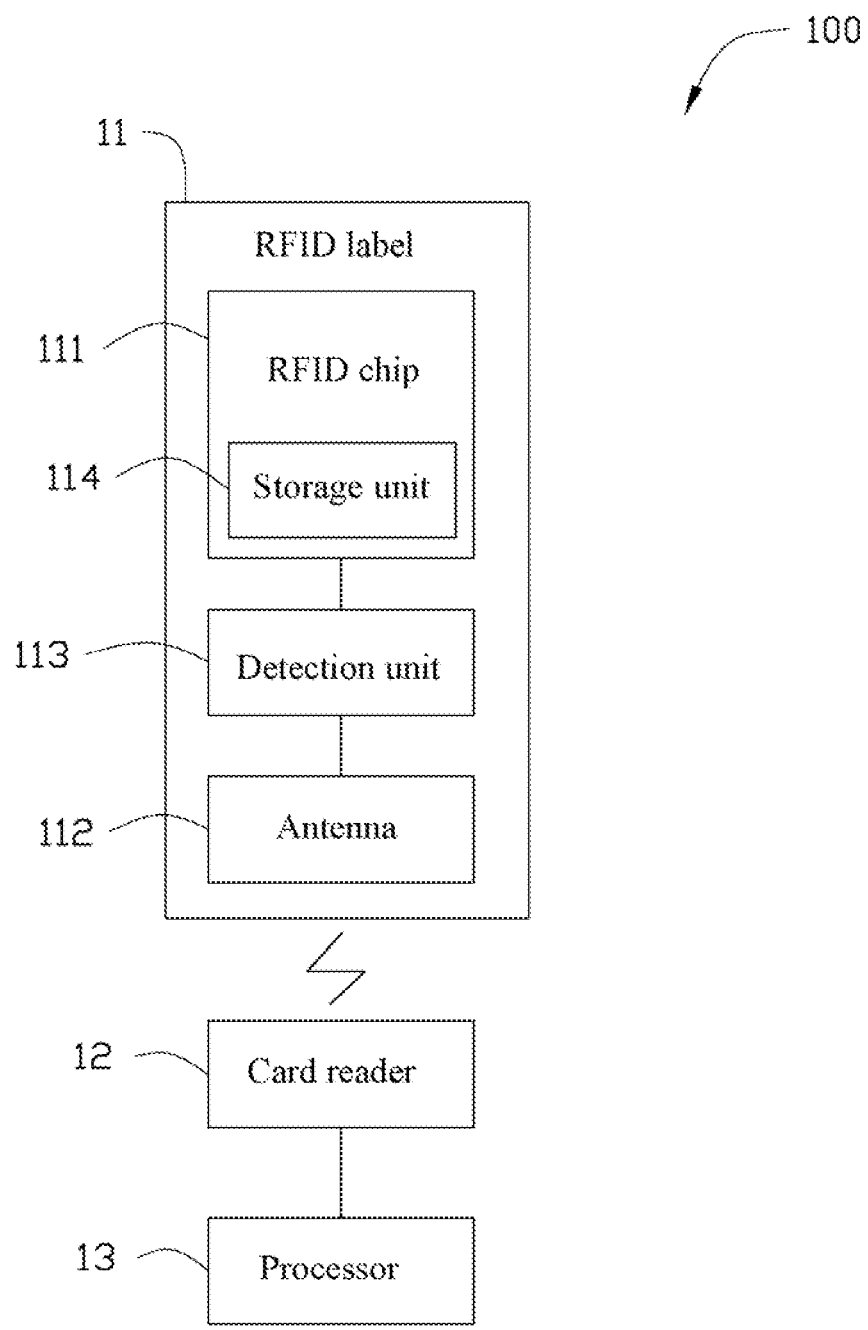
FIG. 1 is a block diagram of a radio frequency identification (RFID) detection device, according to an exemplary embodiment.
Figure 2:
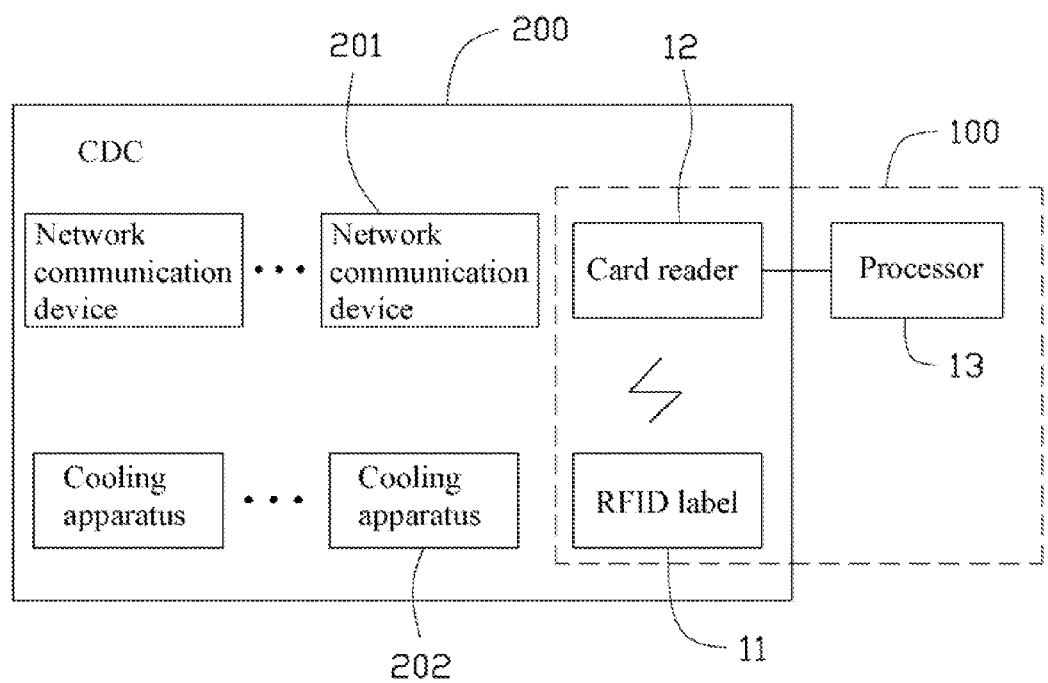
FIG. 2 is a block diagram of a container data center (CDC) in which the RFID detection device shown in FIG. 1 is used.

FIG. 1 is a block diagram of a radio frequency identification (RFID) detection device 100, according to an exemplary embodiment. The RFID detection device 100 can be used in closed places, such as container data centers (CDCs), to detect whether cooling apparatuses of the closed places are working normally. FIG. 2 shows the RFID detection device 100 used in a CDC 200. A plurality of network communication devices 201, such as server devices and storage devices, and a plurality of cooling apparatuses 202 are received in the CDC 200. The cooling apparatuses 202 are water pipes, and the RFID detection device 100 can continuously detect whether the cooling apparatuses 202 fracture and unwanted water enters the CDC 200.

The RFID detection device 100 includes an RFID label 11, a card reader 12, and a processor 13. The card reader 12 is electrically connected to the processor 13, and can wirelessly communicate with the RFID label 11. The RFID label 11 is received in the CDC 200 and includes an RFID chip 111, an antenna 112, and a detection unit 113. The RFID chip 111 is electrically connected to the antenna 112 through the detection unit 113. The RFID chip 111 further includes a storage unit 114, which can be a random access memory (RAM) or a read-only memory (ROM). Acceptable ranges of relevant environment parameters in the CDC 200, such as an acceptable water level range, an acceptable humidity range, and an acceptable temperature range in the CDC 200, can be stored in the storage unit 114.

In this embodiment, the detection unit 113 is a carbon electrode. When the cooling apparatuses 202 work normally (e.g., are not fractured), unwanted water does not enter the CDC 200. Thus, the detection unit 113 electrically connects the RFID chip 111 to the antenna 112 normally, and the RFID chip 111 can wirelessly communicate with the card reader 12 through the detection unit 113 and the antenna 112. If at least one of the cooling apparatus 202 does not work normally (e.g., fractured), unwanted water flows into the CDC 200. When a depth of the unwanted water is in excess of the acceptable water level range stored in the storage unit 114, the detection unit 113 is damped. Thus, electric signals transmitted through the detection unit 113 are interrupted by the unwanted water, and the detection unit 113 is unable to electrically connect the RFID chip 111 to the antenna 112. That is, the detection unit 113 electrically isolates the RFID chip 111 from the antenna 112, such that the RFID label 11 is unable to wirelessly communicate with the card reader 12.

When the card reader 12 is able to wirelessly communicate with the RFID label 11, the card reader 12 generates a first detection signal and transmits the first detection signal to the processor 13. When the card reader 12 is unable to wirelessly communicate with the RFID label 11, the card reader 12 generates a second detection signal and transmits the second detection signal to the processor 13. The processor 13 can be a personal computer (PC), a single chip computer, or other data processor devices. The processor 13 receives the detection signals and determines whether the cooling apparatuses 202 are working normally according to the detection signals.

The following is a particular method for using the RFID detection device 100. In use, the RFID label 11 is attached on an inner surface of the CDC 200, and the detection unit 113 is positioned at a height that equals the maximal value of the acceptable water level range stored in the storage unit 114. Thus, the cooling apparatuses 202 are activated.

When the cooling apparatuses 202 are working, the processor 13 controls the card reader 12 to continuously transmit detection instructions to the RFID label 11. As detailed above, when the cooling apparatuses 202 work normally, unwanted water does not enter the CDC 200. The detection unit 113 electrically connects the RFID chip 111 to the antenna 112 normally, and the RFID chip 111 receives the detection instructions through the detection unit 113 and the antenna 112. Upon receiving each of the detection instructions, the RFID chip 111 generates a response signal and transmits the response signal to the card reader 12 through the detection unit 113 and the antenna 112. When receiving the response signals, the card reader 12 correspondingly generates the first detection signals and transmits the first detection signals to the processor 13. When receiving the first detection signals, the processor 13 determines that all of the cooling apparatuses 202 work normally.

When any one of the cooling apparatuses 202 fractures, unwanted water flows into the CDC 200. When the depth of the unwanted water is in excess of the acceptable water level range stored in the storage unit 114 (i.e., in excess of the height of the detection unit 113), the detection unit 113 is damped and unable to electrically connect the RFID chip 111 to the antenna 112 (i.e., electrically isolating the RFID chip 111 from the antenna 112). Thus, the RFID chip 111 is unable to receive the detection instructions from the card reader 12 and transmit the response signal to the card reader 12. When the card reader 12 does not receive the response signals, the card reader 12 correspondingly generates the second detection signals and transmits the second detection signals to the processor 13. When the processor 13 receives the second detection signals, the processor 13 detects that the RFID chip 111 is unable to wirelessly communicate with the card reader 12 and determines that at least one of the cooling apparatuses 202 has fractured, and can further sounds an alarm.

In the present disclosure, the RFID detection device 100 can detect whether the cooling apparatuses 202 are working normally, and does not require visual detection. Compared with typical detection devices for CDCs, such as surveillance cameras, the RFID detection device 100 is cheaper and does not need additional manpower for visual detection.

If any one of the cooling apparatuses 202 is fractured and the unwanted water flows into the CDC 200, a humidity in the CDC 200 may increase. Furthermore, if any one of the cooling apparatuses 202 encounters other kinds of malfunctions, a temperature in the CDC 200 may increase. Accordingly, in other embodiments, the detection unit 113 can also be a humidity sensor or a temperature sensor. In use, the detection unit 113 electrically isolates the RFID chip 111 from the antenna 112 when the humidity in the CDC 200 is in excess of the acceptable humidity range stored in the storage unit 114 or the temperature in the CDC 200 is in excess of the acceptable temperature range stored in the storage unit 114. That is, the electrical connection through the detection unit 113 can be interrupted by changes of environment parameters in the CDC 200. In this way, when at least one of the cooling apparatuses 202 malfunctions (e.g., is fractured or encounters other kinds of malfunctions), the RFID chip 111 is unable to receive the detection instructions from the card reader 12 and transmit the response signal to the card reader 12, and the processor 13 determines that at least one of the cooling apparatuses 202 malfunctions according to the aforementioned method and can further sounds an alarm.

The RFID detection device 100 can further includes a plurality of RFID labels 11 respectively attached inside a plurality of CDCs 200. Each of the RFID labels 11 wirelessly communicates with the card reader 12 according to the aforementioned method. The storage unit 114 of each of the RFID labels 11 further stores a corresponding serial number of the RFID label 11. In use, the processor 13 controls the card reader 12 to transmit the detection instructions to all of the RFID labels 11, and each of the RFID labels 11 transmits response signals with the serial number of the RFID label 11 to the card reader 12 in response to receiving the detection instructions. If the electrical connection through the detection unit 113 of any one of the RFID labels 11 is interrupted and the RFID label 11 is unable to wirelessly communicate with the card reader 12, as detailed above, the processor 13 detects the absence of the response signals with the serial number of the RFID label 11, and determines that at least one of the cooling apparatuses 202 in the CDC 200 which receives the RFID label 11 malfunctions according to the serial number of the RFID label 11.

Additionally, the RFID chip 111 and the antenna 112 can also be positioned out of the CDC 200 to improve the quality of the wireless communication between the RFID chip 111 and the card reader 12.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A detection device for cooling apparatuses of a container data center (CDC), comprising:
   a processor;
   a card reader electrically connected to the processor; and
   at least one radio frequency identification (RFID) label, the RFID label including an RFID chip, an antenna, and a detection unit, the detection unit received inside the CDC, and the RFID chip electrically connected to the antenna through the detection unit and wirelessly communicating with the card reader through the detection unit and the antenna; the detecting unit detecting whether any one of the cooling apparatuses malfunctions that change environmental parameters of the CDC, and in response to the detection, the detection unit electrically connects the RFID chip to or isolates the RFID chip from the antenna.

2. The detection device as claimed in claim 1, wherein the RFID chip transmits a response signal to the card reader in response to receiving a detection instruction from the card reader, and the processor determines that all of the cooling apparatuses work normally when the card reader transmits a first detection signal to the processor in response to the card reader receiving the response signal.

3. The detection device as claimed in claim 2, wherein the processor determines that at least one of the cooling apparatuses malfunctions when the card reader transmits a second detection signal to the processor in response to not receiving the response signal.

4. The detection device as claimed in claim 3, wherein acceptable ranges of relevant environment parameters in the CDC are stored in the RFID chip, and the detection unit electrically isolates the RFID chip from the antenna when any one of the relevant environment parameters in the CDC is in excess of a corresponding one of the acceptable ranges.

5. The detection device as claimed in claim 4, wherein the acceptable ranges of relevant environment parameters in the CDC stored in the RFID chip include an acceptable water level range, an acceptable humidity range, and an acceptable temperature range in the CDC.

6. The detection device as claimed in claim 5, wherein the cooling apparatuses are water pipes, and the detection unit is a carbon electrode positioned at a height that equals the maximal value of the acceptable water level range in the CDC; and when a depth of unwanted water in the CDC is in excess of the acceptable water level range, the detection unit electrically isolates the RFID chip from the antenna.

7. The detection device as claimed in claim 5, wherein the cooling apparatuses are water pipes and the detection unit is a humidity sensor; and in response to unwanted water in the CDC and a humidity in the CDC being in excess of the acceptable humidity range, the detection unit electrically isolates the RFID chip from the antenna.

8. The detection device as claimed in claim 5, wherein the detection unit is a temperature sensor; and in response to a temperature in the CDC exceeding the acceptable temperature range, the detection unit electrically isolates the RFID chip from the antenna.

9. The detection device as claimed in claim 1, wherein the processor determines that at least one of the cooling apparatuses in the CDC malfunctions according to a serial number of an RFID label attached inside the CDC sent by the RFID label communicating with the card reader.

* * * * *